United States Patent [19]
Stein

[11] 4,084,190
[45] Apr. 11, 1978

[54] IMAGE SENSOR

[75] Inventor: Karl-Ulrich Stein, Munich, Germany

[73] Assignee: Siemens Aktiengesellschaft, Berlin & Muhich, Germany

[21] Appl. No.: 725,536

[22] Filed: Sep. 22, 1976

[30] Foreign Application Priority Data

Sep. 26, 1975 Germany .............................. 2543083

[51] Int. Cl.² ........................ H04N 3/14; H01J 39/12; H01L 29/06
[52] U.S. Cl. ................................ 358/213; 250/211 J; 357/30; 357/32
[58] Field of Search ........................... 357/30, 32, 24; 307/311, 221 D; 250/211 J; 358/213

[56] References Cited

U.S. PATENT DOCUMENTS

| 3,683,193 | 8/1972 | Weimer ................................... 357/24 |
| 3,700,961 | 10/1972 | Fletcher et al. ....................... 357/32 |
| 3,763,480 | 10/1973 | Weimer ................................... 357/24 |
| 3,781,574 | 12/1973 | White et al. ............................ 357/24 |
| 3,969,636 | 7/1976 | Baertsch et al. ............. 307/221 D X |
| 4,000,418 | 12/1976 | Waldron et al. .................... 357/32 X |

FOREIGN PATENT DOCUMENTS 1,306,735  2/1973  United Kingdom .................. 357/30

OTHER PUBLICATIONS

Jespers et al., "Three-Terminal Charge-Injection Device," *IEEE Journal of Solid-State Circuits*, vol. SC-11, No. 1, Feb. 1976, pp. 133-139.

*Primary Examiner*—Stanley D. Miller, Jr.
*Assistant Examiner*—James W. Davie
*Attorney, Agent, or Firm*—Hill, Gross, Simpson, Van Santen, Steadman, Chiara & Simpson

[57] ABSTRACT

An image sensor includes a plurality of parallel spaced apart semiconductor strips carried on an electrically insulating substrate and covered with at least one layer of light-permeable electrically insulating material. A plurality of parallel spaced apart electrically conductive strips are carried by the layer of light-permeable insulating material transversely of the semiconductor strips. Advantageously, the semiconductor strips may consist of epitaxial semiconductor strips, for example silicon and the electrically conductive strips may consist of polysilicon. The electrically insulating layer, at least below the electrode strips, is thinner over a longitudinal half of each strip than in the remaining areas of the layer, and each strip of doped semiconductor material is doped to a greater degree below the thicker-portions of the electrically insulating layer.

13 Claims, 9 Drawing Figures

IMAGE SENSOR

BACKGROUND OF THE INVENTION

1. Field of the Invention

The present invention relates to an image sensor, and is more particularly concerned with a multi-layer image sensor structure having orthogonally related semiconductor and electrically conductive electrodes which are separated by an electrically insulating layer.

2. Description of the Prior Art

A simple technology is required for image sensors, which sensors permit a small defect density of large surface arrays. Futhermore, a dot-shaped defect, which renders an image sensor useless or a selection element useless, is only noticeable as a dot-shaped image defect and not as a defect of an image line or an image field. According to CCD principles, an example of which is illustrated in the publication "Carrier Diffusion Degradation of Modulation Transfer Function in Charge-Coupled Images" by D.H. Seib in the IEEE Vol. ED-21, No. 3, 1974, Pages 210–217, CCD devices do not comply with these requirements. However, the publication "Charge Injection Imaging" by G. J. Michon and A. K. Burke, Digest of the ISSCC, 1973, Page 138, offers a first step for the solution of these problems with its dot-by-dot readout. However, it is a drawback of this arrangement that the readout signal occurs as a current at a substrate electrode which has a relatively great capacitance with respect to ground. The signal voltage occurring is relatively small since the substrate capacitance grows in proportion to the number of integrated sensor elements. This causes a limitation in the resolution or sensitivity of the sensor in the case of a given sensitivity of the signal amplifier.

SUMMARY OF THE INVENTION

It is therefore the primary object of the invention to provide an image sensor having a capacitance, with respect to the readout process, which can be maintained very small.

This object is achieved in an image sensor in which a plurality of parallel spaced-apart doped semiconductor strips are arranged on an electrically insulating substrate and covered with at least one layer of light-permeable electrically insulating material, and in which a plurality of parallel spaced apart electrode strips, constructed of electrically conductive material, are supported on the insulating layer transversely of the strips of semiconductor material. Therefore, the capacitance which is relevant for the readout process is reduced, on one hand, by the capacitances of a substrate strip with respect to the electrode strips, and, on the other hend, due to the housing of the image sensor. The mutual capacitance of the strips can be maintained small.

Advantageously, each strip of semiconductor material consists of an epitaxial semiconductor layer. The sensor can thus be produced without problems in utilizing epitaxial semiconductor film technology. Preferably, the epitaxial semiconductor layer consists of silicon. Thereby, the electrically insulating layer advantageously consists of silicon dioxide, and the electrode strips, preferably, consist of polysilicon. The electrically insulating substrate preferably consist of sapphire or spinel.

It is advantageous when the electrically insulating layer has a thinner layer thickness at least below the electrode strips over one longitudinal half of each strip than in other areas of the layer. It is thereby advantageous when the layer thickness of the strips is less than 0.8 μm. In order to improve the conductive behavior it is again advantageous when each strip is doped to a greater degree below the thicker electrically insulating layer.

An image sensor constructed in accordance with the invention provides that the signal voltage may be made so large that it can be further processed in one or more read amplifiers carried upon the same chip. An advantageous embodiment thereby consists in that each strip is connected to a parallel input of an analog parallel-series shift register, by way of a separation and amplifier stage, respectively. Preferably, the shift register consists of a charge-coupled transmission device (CCD device).

In another advantageous embodiment of the invention, each strip is connected with a terminal contact provided for taking off the output signal, by way of at least one switch transistor, and the control electrode of each switch transistor is connected to a parallel output of a line selection circuit. Advantageously, MIS switch transistors are used. Preferably, the strips are connected with the terminal contact by way of at least one amplifier element.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
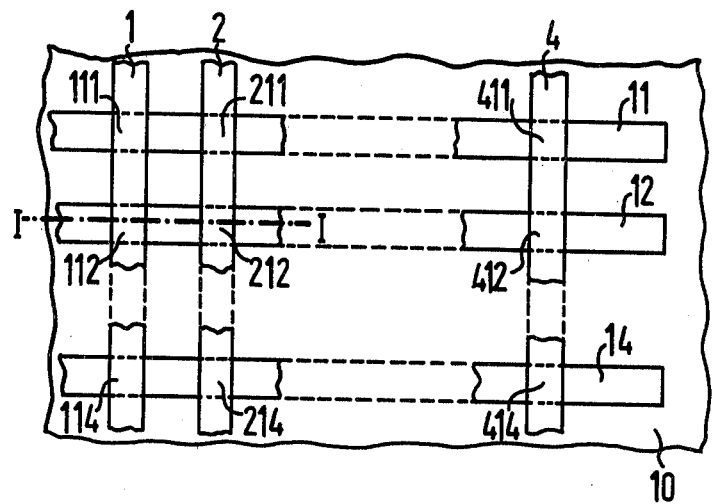
FIG. 1 is a plan view of an image sensor constructed in accordance with the invention.

In FIG. 1 a plurality of strips of doped semiconductor material 11–14 are arranged parallel and spaced apart upon a substrate 10 of electrically insulating material. Each of the strips 11–14 is entirely covered by a light-permeable electrically insulating layer which has not been illustrated on the drawing for the purpose of clarity. A plurality of electrode strips 1–4 are made of electrically conductive material and extend parallel and spaced apart and are supported by the light-permeable electrically insulating layer in an orientation which is transverse to the strips 11-14. The sensor elements are indicated by the surface members 111-414.

Figure 2:
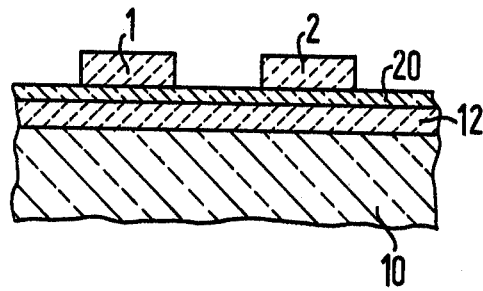
FIG. 2 is a sectional view of the structure of FIG. 1 taken generally along the section line I—I.

FIG. 2 is a transverse sectional view taken through the image sensor illustrated in FIG. 1 along the line I—I. The strip 12, for example a p-doped silicon strip, is applied upon the electrically insulating substrate 10 which consists of, for example, spinel or sapphire. The strip 12 is entirely covered by a light-permeable electrically insulating layer 20, such as silicon dioxide. The electrode strips 1 and 2, for example polycrystalline silicon, are carried upon the insulating layer 20.

Figure 3:
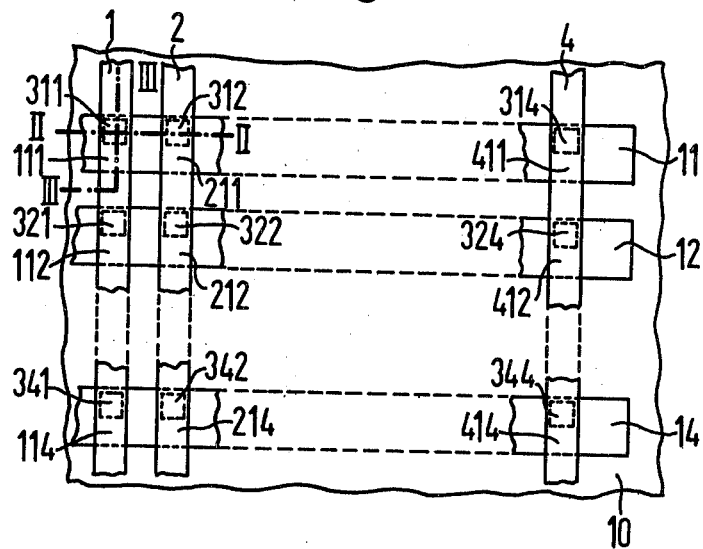
FIG. 3 is a plan view of another image sensor constructed in accordance with the invention, the image sensor being similar to the image sensor of FIG. 1.

FIG. 3 is a plan view of a variation of the image sensor illustrated in FIG. 1. The image sensor of FIG. 3 differs from that of FIG. 1 in that the electrically insulating layer has a thinner layer thickness below the electrode strips over a longitudinal half of the strip. These areas of thinner electrically insulating layer are framed by a broken line in FIG. 3 and are provided with the reference numerals 311-344.

Figure 4:
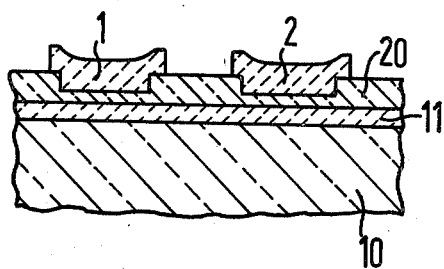
FIG. 4 is a transverse sectional view taken generally along the line II—II of FIG. 3 for the case that the electrically insulating layer in a half of a longitudinal strip is thinner below the strips of electrically insulating material than in other areas.

In FIG. 4 a transverse section is illustrated taken along the line II—II in FIG. 3. The layer thickness of the electrically insulating layer 20 is less in the area below the electrode strips 1 and 2 than in other areas of the layer 20.

Figure 5:
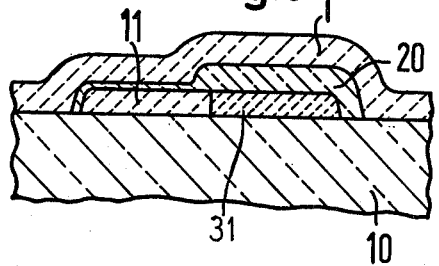
FIG. 5 is a transverse cross sectional view taken along the line III—III in FIG. 3.

FIG. 5 is a transverse section taken along the line III—III in FIG. 3. The strip 11 is more highly doped in the area 31 below the thicker electrically insulating layer 20 than beyond. This serves for collecting the charge carriers during the readout process and for improving the conductive behavior. In the case of the image sensor illustrated in FIG. 3 and in FIGS. 4 and 5, the layer thickness of these strips of doped semiconductor material is preferably thinner than the thickness of the maximum barrier layer which is produced by the timing pulse voltages at the strips 1-4.

Figure 6:
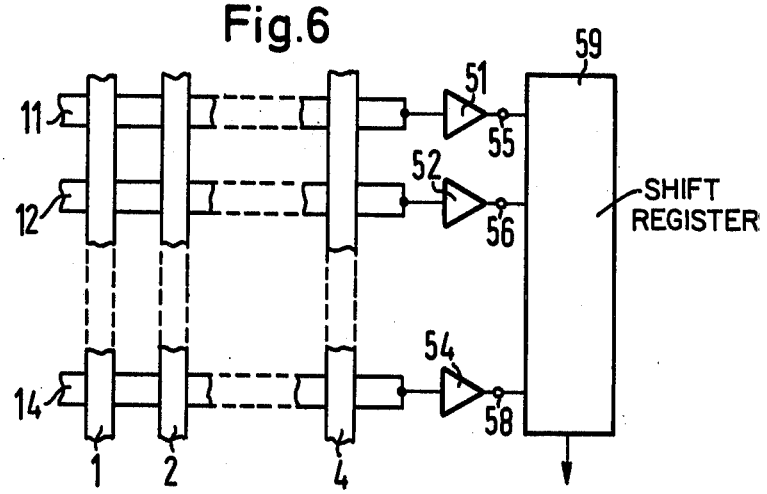
FIG. 6 is a schematic illustration showing a plan view of an image sensor in which the strips of doped semiconductor material are connected with a parallel input of a parallel-series shift register, via a separation and signal amplifier stage, respectively.

In FIG. 6, each of the strips 11-14 of the sensor constructed in accordance with FIG. 1 or the sensor constructed in accordance with FIG. 3 is connected with a parallel input 55-58 of an analog shift register 59, such as a charge-coupled transmission device, by way of a separation and signal amplifier stage 51-54, respectively, as a parallel-series converter. The separation and amplifier stages and the shift register may be integrated upon the same shift as the image sensor.

Figure 7:
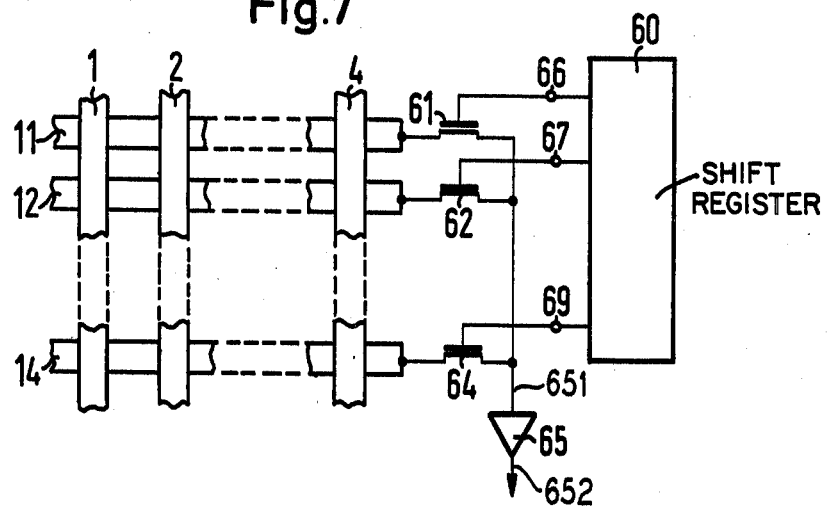
FIG. 7 is a schematic diagram showing a plan view of a sensor connected with a line selection circuit.

In FIG. 7, each of the strips 11-14 is connected with an input 651 of a signal amplifier 65, by way of a switch transistor 61-64, respectively, whereby an output 652 of the signal amplifier 65 forms the output signal. Each control electrode input of each switch transistor 61-64 is connected to a parallel input 66-69, respectively, of a line selection circuit 60 which, for example, may consist of a digital parallel-series shift register. The switch transistors 61-64 are, advantageously, MIS transistors. The switch transistors 61-64, the signal amplifier 65 and the line selection circuit 60 may be integrated upon the chip with the image sensor.

Figure 8:
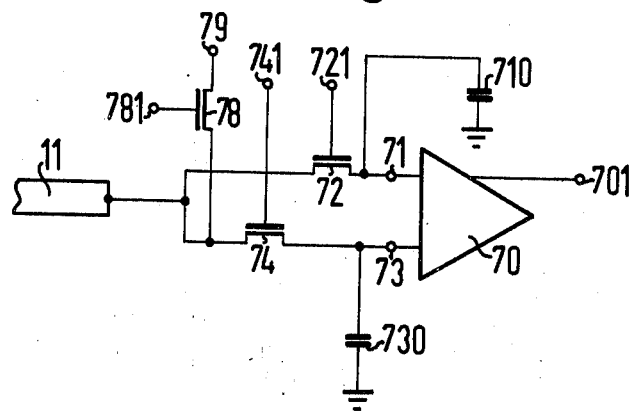
FIG. 8 is a schematic circuit diagram of an embodiment of a separation and amplifier stage.

A particularly suitable separation and signal amplifier stage for the image sensor of FIG. 5 is illustrated in FIG. 8, as an example of execution. The circuit comprises a differential amplifier 70 having two inputs 71 and 73 and an output 701. The input 71 is connected with the associated strip of doped semiconductor material by way of a switch transistor 72 having a gate electrode 721, while the other input 73 is connected with the same doped semiconductor strip by way of a switch transistor 74 having a gate electrode 741. The difference inputs 71 and 73 of the differential amplifier are connected with the bottom of the housing or chassis by way of a respective capacitors 710 and 730. Furthermore, the strip is connected with a terminal contact 79 by way of a further switch transistor 78 having a gate electrode 781. The switch transistors 72, 74 and 78 are preferably MIS transistors.

An image sensor constructed in accordance with the invention is generally operated in such a manner that the strips are brought to a defined potential $U_1$, with respect to a reference potential $U_0$ (usually ground) of the bottom of the housing, by way of a short-time application of a voltage to the strips. In order to carry this out, it is most simple when each strip is connected with a corresponding voltage source via a respective switch transistor. By applying a pulse to the gate electrode of the switch transistor the switch transistor is brought into a state of conduction for a short time so that the respective strip is connected to the potential $U_1$ for a short time. Hereafter, at a latest, the voltage $U_G$ with respect to the potential $U_0$ is applied to an electrode strip and the voltage is of such a magnitude that an inversion boundary layer can form in the strip by way of exposure. After the formation of this inversion boundary layer, a voltage $U_g$ with respect to $U_0$ is applied to the electrode strip and provides that the inversion boundary layer disappears, whereby the amount of charge $\Delta Q$ required for the charge balance is supplied by the strip. The voltage change $\Delta U = \Delta Q/C_{SUB}$ produced forms the output signal, where $C_{SUB}$ is the capacitance of the capacitor formed by the strip over the substrate 10 with the housing bottom. The previously stated method steps are individually repeated one after the other for each electrode strip. As has been previously mentioned, the capacitance $C_{SUB}$ is small, as compared with the conventional image sensors, so that, compared to conventional sensors, the much larger output signal $\Delta U$ is obtained. The output signal is amplified by way of at least one amplifier and further processed. In the case of a layer thickness of the strips of less than 0.8 μm, the amount of voltage $U_G$ is preferably selected in such a way that the inversion boundary layer extends over the entire layer thickness of the strip.

Figure 9:
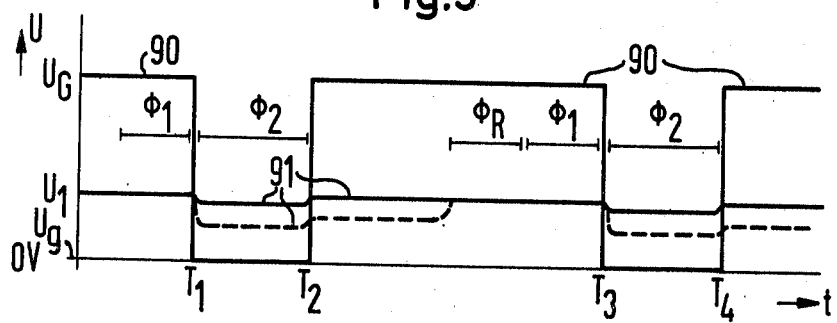
FIG. 9 is a voltage pulse diagram with respect to time $t$.

A practical realization of the method of operation is explained with the help of the example of the separation and amplifier stage constructed in accordance with FIG. 8, and voltage diagrams for such operation are illustrated, with respect to time $t$, in FIG. 9. The voltage diagram 90 represents the voltages $U_G$ and $U_g$ which are to be applied to the electrode strips. The voltage diagram 91 illustrates the voltages at the strip. Until the time $T_1$, the voltage $U_G$ is present at an electrode strip and, until the time $T_2$, the voltage $U_g = 0$ Volts. In the time $T_3 - T_2$, the voltage $U_G$ is applied to the following electrode strip, while the voltage $U_g = 0$ Volts is also provided during the following time $T_4 - T_3$, etc. At least in the time intervals when the voltage $U_G$ is applied to an electrode strip, the sensor will be exposed. Before the time $T_1$, a preparation pulse $\phi_1$, ending at the time $T_1$ or shortly before, is applied to the gate electrode of the transistor 74. This preparation pulse opens the switch transistor 74 and charges the capacitance 730 to the voltage of the strip made of doped semiconductor material. Thus, the difference input 73 has this voltage, even after the pulse is ended. At the time $T_1$, the inversion boundary layer produced in the strip by way of exposure is caused to disappear below the electrode strip, which produces the voltage change $\Delta U$. At the time $T_1$ or shortly afterwards, a signal pulse $\phi_2$ is applied to the gate electrode of the switch transistor 72, and thus the voltage change ΔU is processed to a second difference input 71 of the differential amplifier and is amplified to form an output signal. The continuous part of the curve 91 during the interval $T_2 - T_1$ holds true for the case that the sensor element has not been exposed and thus no inversion boundary layer, or only a very weak boundary layer, has formed. The portion of the curve 91 in this area, which is illustrated in a broken line, holds true for the case that full exposure occurred and thus a strong inversion boundary layer has formed. At the time $T_2$, the voltage $U_G$ is applied to a following electrode strip and, thus, an inversion boundary layer is again produced in the strips. After the time $T_2$, a reset pulse $\phi_R$ is first of all applied to the gate electrode of the switch transistor 78 and brings the strip to the potential $U_1$, the potential at which the terminal 79 must be placed. Hereafter, the previously described processes repeat in a corresponding manner.

The sensor illustrated in FIG. 6 is operated in such a way that the strips are read out by way of the separation amplifier stages in parallel into the storage cells of the parallel-series shift register 59, after which the information stored in the shift register is read out in series.

The image sensor illustrated in FIG. 7 is read out in such a manner that the switch transistors 61–64 are opened one after the other, via the line selection circuit, and thus the individual strips are read out one after the other, whereby the output signal is amplified by way of the amplifier 65.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An image sensor comprising:
an electrically insulating substrate;
a plurality of first strips of doped semiconductor material carried spaced apart on said substrate;
at least one layer of light-permeable electrically insulating material covering said first strips; and
a plurality of second strips of electrically conductive material carried spaced-apart on said layer of light-permeable electrically insulating material transverse to said first strips, said insulating layer comprising less thickness, at least below said second strips, over one longitudinal half of each of said first strips, than over the remaining areas of said sensor.

2. The image sensor of claim 1, wherein:
each of said first strips is doped to a greater degree below the thicker portions of said insulating layer than below other portions thereof.

3. The image sensor of claim 2, wherein:
each of said first strips is an epitaxial semiconductor layer.

4. The image sensor of claim 2, wherein:
each of said first strips comprises silicon.

5. The image sensor of claim 2, wherein:
said substrate comprises sapphire.

6. The image sensor of claim 2, wherein:
said substrate comprises spinel.

7. The image sensor of claim 2, wherein:
said second strips comprise polysilicon.

8. The image sensor of claim 1, comprising:
at least one amplifier, each of said first strips connected to an input of said amplifier.

9. The image sensor of claim 1, comprising:
a plurality of amplifiers, each of said amplifiers including an input connected to a respective first strip; and
a shift register including a set of parallel inputs connected to the outputs of respective amplifiers.

10. The image sensor of claim 9, wherein:
said shift register comprises a charge-coupled transmission device.

11. The image sensor of claim 1, comprising:
an amplifier including an input;
a plurality of switching transistors each including a control electrode, and a signal path connected between a respective first strip and said input of said amplifier; and
a selection circuit including a plurality of outputs each connected to a respective control electrode and operable to selectively connect a first line to said amplifier.

12. The image sensor of claim 11, wherein:
said switching transistors are MIS switching transistors.

13. The image sensor of claim 1, comprising:
a plurality of differential amplifiers, one for each first strip, each including first and second inputs and an output;
a pair of switching transistors, each transistor having a control electrode, and a signal path connected to the same first strip and to respective ones of said first and second inputs, said control electrodes adapted for sequential enablement of said transistors;
a pair of capacitors for each amplifier connecting respective inputs to a reference potential; and
a reset transistor for each first strip, including a control electrode for receiving a reset pulse, and a controlled path connected between the respective first strip and a reset potential.

* * * * *